United States Patent
Li et al.

(10) Patent No.: US 10,243,512 B2
(45) Date of Patent: Mar. 26, 2019

(54) PHOTOVOLTAIC JUNCTION BOX WITH SOLDERING SURFACES OF UNEQUAL SURFACE AREA

(71) Applicant: Tyco Electronics (Shanghai) Co. Ltd., Shanghai (CN)

(72) Inventors: Cui Li, Shanghai (CN); Wenbo Lv, Shanghai (CN); Xiang Xu, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 6 days.

(21) Appl. No.: 15/344,005

(22) Filed: Nov. 4, 2016

(65) Prior Publication Data
US 2017/0133981 A1 May 11, 2017

(30) Foreign Application Priority Data
Nov. 6, 2015 (CN) .......................... 2015 1 0750599

(51) Int. Cl.
*H01L 23/31* (2006.01)
*H01R 13/73* (2006.01)
*H02S 40/34* (2014.01)
*H01L 23/495* (2006.01)

(52) U.S. Cl.
CPC .......... *H02S 40/34* (2014.12); *H01L 23/3114* (2013.01); *H01L 23/49562* (2013.01); *H01R 13/73* (2013.01); H01L 2224/40245 (2013.01)

(58) Field of Classification Search
None
See application file for complete search history.

(56) References Cited

U.S. PATENT DOCUMENTS

| | | | | |
|---|---|---|---|---|
| 8,128,439 | B2 * | 3/2012 | Feldmeier | B32B 17/10036 439/709 |
| 8,737,042 | B2 * | 5/2014 | Yoshikawa | H02S 40/345 174/549 |
| 9,398,725 | B2 * | 7/2016 | Yamazaki | H02S 40/345 |
| 9,813,019 | B2 * | 11/2017 | Zhong | H02S 40/34 |
| 9,859,841 | B2 * | 1/2018 | Lv | H02S 40/345 |
| 2004/0177987 | A1 * | 9/2004 | Yoshikawa | H01R 9/2425 174/59 |
| 2005/0054219 | A1 * | 3/2005 | Werner | H02S 40/34 439/76.1 |
| 2005/0197001 | A1 * | 9/2005 | Higashikozono | H01R 9/16 439/485 |
| 2005/0224110 | A1 * | 10/2005 | Yoshikawa | H01L 31/02008 136/251 |

(Continued)

*Primary Examiner* — Dimary S Lopez Cruz
*Assistant Examiner* — Muhammed Azam
(74) *Attorney, Agent, or Firm* — Barley Snyder

(57) ABSTRACT

The photovoltaic junction box comprises a box body, a plurality of terminals disposed in the box body, and a plurality of diodes disposed in the box body. A first terminal of the plurality of terminals is directly connected to a positive wire extending into the box body and a second terminal of the plurality of terminals is disposed adjacent to the first terminal. A first diode of the plurality of diodes has a first positive pin with a first positive soldering surface soldered on the first terminal and a first negative pin with a first negative soldering surface soldered on the second terminal. The first positive soldering surface has a larger surface area than the first negative soldering surface.

15 Claims, 4 Drawing Sheets

(56) References Cited

U.S. PATENT DOCUMENTS

| | | | | |
|---|---|---|---|---|
| 2005/0236031 | A1* | 10/2005 | Higashikozono | H02S 40/34 136/251 |
| 2009/0086444 | A1* | 4/2009 | Yoshikawa | H02G 3/16 361/752 |
| 2010/0263714 | A1* | 10/2010 | Lauermann | H02S 40/34 136/251 |
| 2012/0048614 | A1* | 3/2012 | Xue | H02G 3/16 174/520 |
| 2012/0052719 | A1* | 3/2012 | Xue | H02G 3/16 439/485 |
| 2012/0075825 | A1* | 3/2012 | Yamazaki | H02S 40/34 361/809 |
| 2012/0125682 | A1* | 5/2012 | Lu | H05K 7/20409 174/548 |
| 2012/0174970 | A1* | 7/2012 | Yoshikawa | H02S 40/34 136/252 |
| 2012/0224339 | A1* | 9/2012 | Yoshikawa | H02S 40/34 361/752 |
| 2012/0314356 | A1* | 12/2012 | Yoshikawa | H02S 40/34 361/679.01 |
| 2017/0063298 | A1* | 3/2017 | Lv | H02S 40/34 |
| 2017/0063299 | A1* | 3/2017 | Zhong | H02G 3/14 |
| 2017/0133981 | A1* | 5/2017 | Li | H01L 23/3114 |
| 2017/0162482 | A1* | 6/2017 | Kadoguchi | H01L 23/49582 |
| 2017/0163211 | A1* | 6/2017 | Lv | H02S 40/34 |

* cited by examiner

PHOTOVOLTAIC JUNCTION BOX WITH SOLDERING SURFACES OF UNEQUAL SURFACE AREA

CROSS-REFERENCE TO RELATED APPLICATION

This application claims the benefit of the filing date under 35 U.S.C. § 119(a)-(d) of Chinese Patent Application No. 201510750599.5, filed on Nov. 6, 2015.

FIELD OF THE INVENTION

The present invention relates to a photovoltaic junction box, and more particularly, to a photovoltaic junction box mounted on a solar panel.

BACKGROUND

A solar panel, as is known in the art, is a device for collecting solar energy and converting solar energy into electrical energy. When the solar panel is shaded by clouds or leaves, a shadow region is formed on a portion of the solar panel. A shaded solar panel produces a hot spot effect in which the solar panel is burned, impairing functionality of the solar panel. Bypass diodes in a photovoltaic junction box mounted on the solar panel prevent the solar panel from being burned by the hot spot effect.

FIGS. 1 and 2 show a photovoltaic junction box known in the prior art. The photovoltaic junction box has a box body 100' with four terminals 210', 220', 230', 240' and three diodes 310', 320', 330' arranged in the box body 100'. Each of the three diodes 310', 320', 330' is mounted between adjacent terminals 210', 220', 230', 240'. A conductor core 11' of a positive wire 10' introduced into the box body 100' is directly electrically connected to the terminal 210', and a conductor core 21' of a negative wire 20' introduced into the box body 100' is directly electrically connected to the terminal 240'.

As shown in FIGS. 1 and 2, each of the three diodes 310', 320', 330' has a positive pin 311', 321', 331' and a negative pin 312', 322', 332' soldered on the adjacent two terminals 210', 220', 230', 240', respectively. A soldering bottom surface of each negative pin 312', 322', 332' is larger than that of a soldering bottom surface of each positive pin 311', 321', 331'. The positive pin 311' of the diode 310' is soldered on the terminal 210'. The negative pin 312' of the diode 310' is soldered on the terminal 220'. A chip (not shown, which is packaged in a package body) for the diode 310' is directly soldered on a top surface of the negative pin 312' of the diode 310'. Since the area of the soldering bottom surface of the negative pin 312' of the diode 310' is larger than that of the soldering bottom surface of the positive pin 311' of the diode 310', the heat generated by the chip for the diode 310' in use is mostly transferred to the terminal 220' via the negative pin 312'.

As shown in FIGS. 1 and 2, the terminal 220' receiving most of the generated heat is not directly connected to the conductor 11' of the positive wire 10', and consequently, the heat transferred to the terminal 220' cannot be rapidly dissipated to an area external of the box body 100'. It will lead to the diode 310' being burned due to overheating. Once the diode 310' is damaged, the diode 310' cannot play a bypass role, and the solar panel will be burned due to the hot spot effect.

SUMMARY

An object of the invention, among others, is to provide a photovoltaic junction box in which heat generated by diodes in use is rapidly dissipated to an area external of a box body. The disclosed photovoltaic junction box comprises a box body, a plurality of terminals disposed in the box body, and a plurality of diodes disposed in the box body. A first terminal of the plurality of terminals is directly connected to a positive wire extending into the box body and a second terminal of the plurality of terminals is disposed adjacent to the first terminal. A first diode of the plurality of diodes has a first positive pin with a first positive soldering surface soldered on the first terminal and a first negative pin with a first negative soldering surface soldered on the second terminal. The first positive soldering surface has a larger surface area than the first negative soldering surface.

BRIEF DESCRIPTION OF THE DRAWINGS

The invention will now be described by way of example with reference to the accompanying figures, of which.

DETAILED DESCRIPTION OF THE EMBODIMENT(S)

Figure 1:
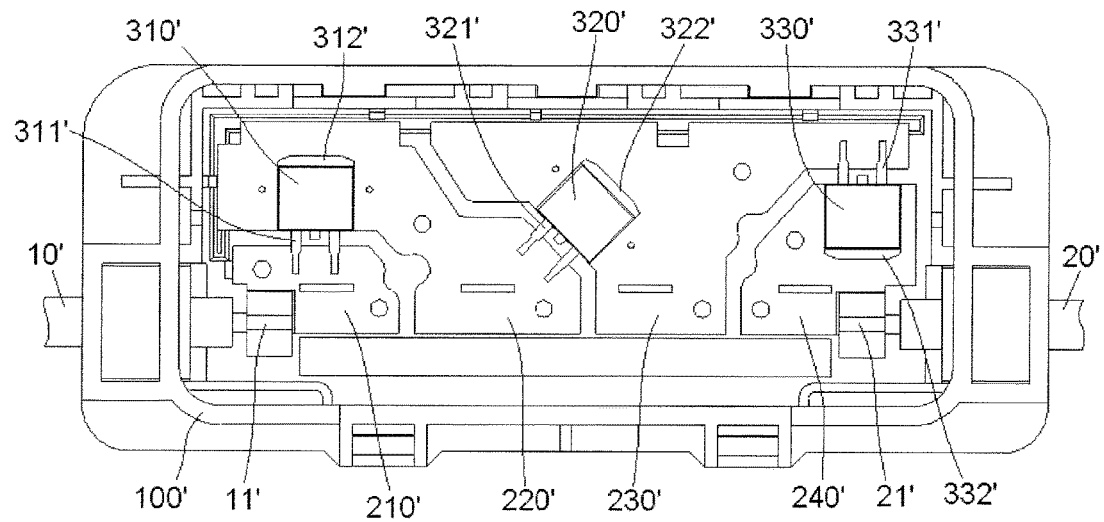
FIG. 1 is a plan view of a photovoltaic junction box in the prior art.
Figure 2:
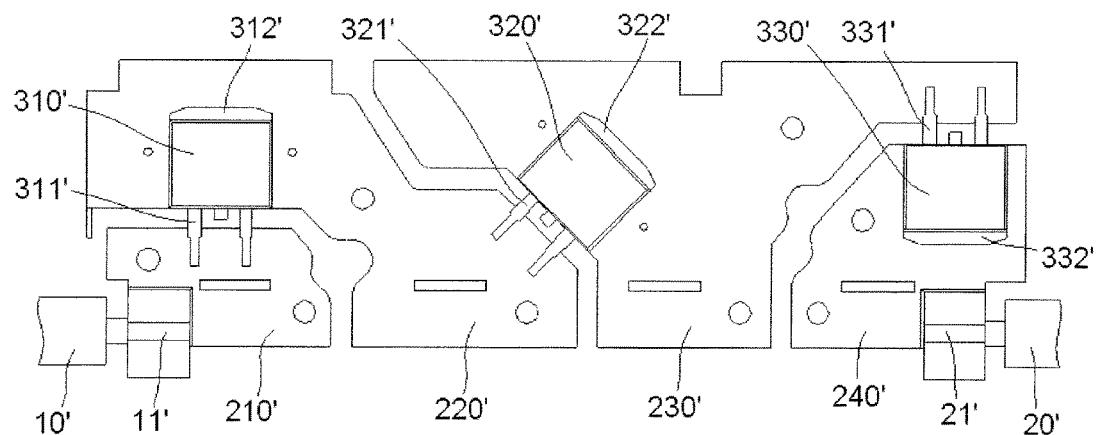
FIG. 2 is a plan view of terminals and diodes of the photovoltaic junction box of FIG. 1.

Embodiments of the present disclosure will be described hereinafter in detail with reference to the attached drawings, wherein the like reference numerals refer to the like elements. The present disclosure may, however, be embodied in many different forms and should not be construed as being limited to the embodiments set forth herein; rather, these embodiments are provided so that the present disclosure will be thorough and complete, and will fully convey the concept of the disclosure to those skilled in the art.

Figure 3:
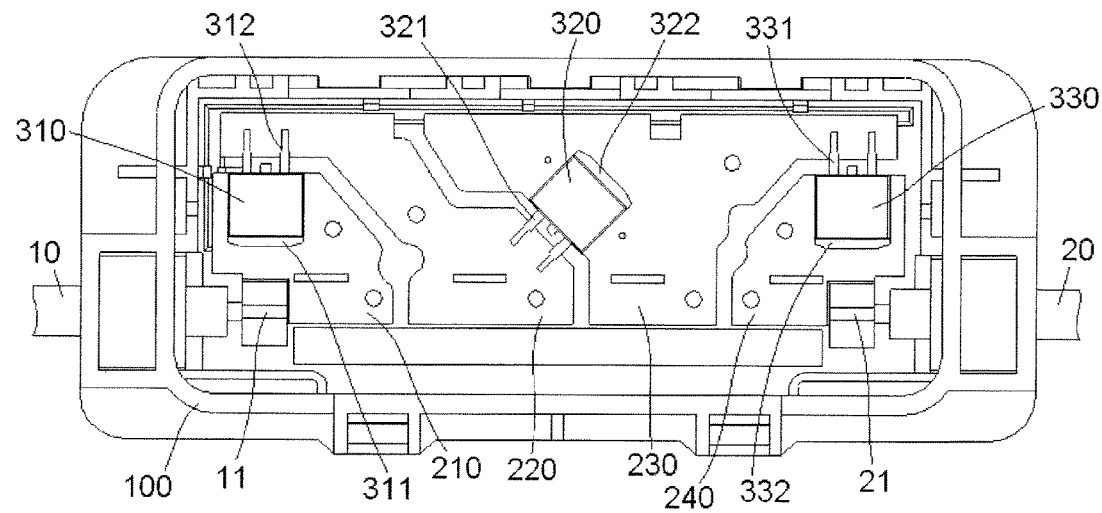
FIG. 3 is a plan view of a photovoltaic junction box according to the invention.

A photovoltaic junction box according to the invention is shown in FIGS. 3-7. As shown in FIG. 3, the photovoltaic junction box has a box body 100, a plurality of terminals 210, 220, 230, 240 and a plurality of diodes 310, 320, 330. The plurality of terminals 210, 220, 230, 240 and the plurality of diodes 310, 320, 330 are arranged in the box body 100. Each of the plurality of diodes 310, 320, 330 is mounted on adjacent terminals 210, 220, 230, 240.

Figure 4:
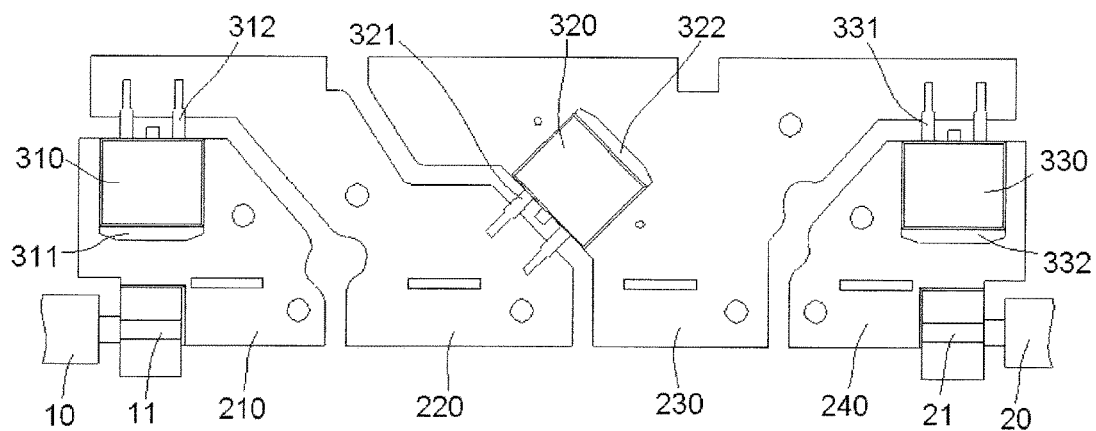
FIG. 4 is a plan view of terminals and diodes of the photovoltaic junction box of FIG. 3.

As shown in FIGS. 3 and 4, the plurality of terminals 210, 220, 230, 240 comprise a first terminal 210 directly electrically connected to a positive wire 10 extending into the box body 100 and a second terminal 220 adjacent to the first terminal 210. The plurality of diodes 310, 320, 330 comprise a first diode 310 mounted on the first terminal 210 and the second terminal 220. The first diode 310, as shown in FIG. 5, has a first chip 313, a positive pin 311 soldered on the first terminal 210 and a negative pin 312 soldered on the second terminal 220.

Figure 5:
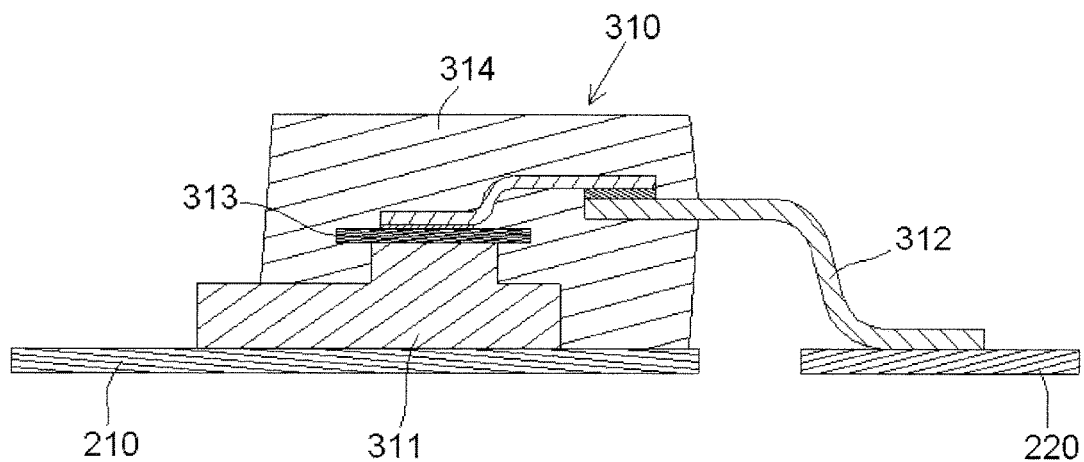
FIG. 5 is a sectional view of a first diode of the diodes of FIG. 4.

As shown in FIG. 5, the first chip 313 of the first diode 310 is directly electrically connected to the positive pin 311 of the first diode 310; the first chip 313 of the first diode 310 may be directly soldered on a top surface of the positive pin 311 of the first diode 310. A positive soldering surface of a bottom of the positive pin 311 of the first diode 310, which is soldered directly onto a surface of the first terminal 210, has a larger surface area than a negative soldering surface of a bottom of the negative pin 312 of the first diode 310, which is soldered directly onto a surface of the second terminal 220. The positive soldering surface of the positive pin 311 may have between 2 and 1000 times the surface area of the negative soldering surface of the negative pin 312, between 10 and 500 times the surface area of the negative soldering surface of the negative pin 312, or between 20 and 100 times the surface area of the negative soldering surface of the negative pin 312.

The positive pin 311 is disposed on a bottom of a package body 314 of the first diode 310, as shown in FIG. 5, and is electrically connected to a positive surface of the first chip 313 of the first diode 310. The negative pin 312 of the first diode 310 is electrically connected to a negative surface of the first chip 313 and extends out from a side of the package body 314. As shown in FIGS. 3 and 4, in an embodiment, the positive pin 311 is a single welding pad and the negative pin 312 has a pair of welding strips spaced apart from each other.

As shown in FIGS. 3 and 4, the plurality of terminals 210, 220, 230, 240 further comprise a third terminal 230 adjacent to the second terminal 220. The plurality of diodes 310, 320, 330 further comprise a second diode 320 mounted on the second terminal 220 and the third terminal 230. The second diode 320, as shown in FIG. 6, has a second chip 323, a positive pin 321 soldered on the second terminal 220, and a negative pin 322 soldered on the third terminal 230.

Figure 6:
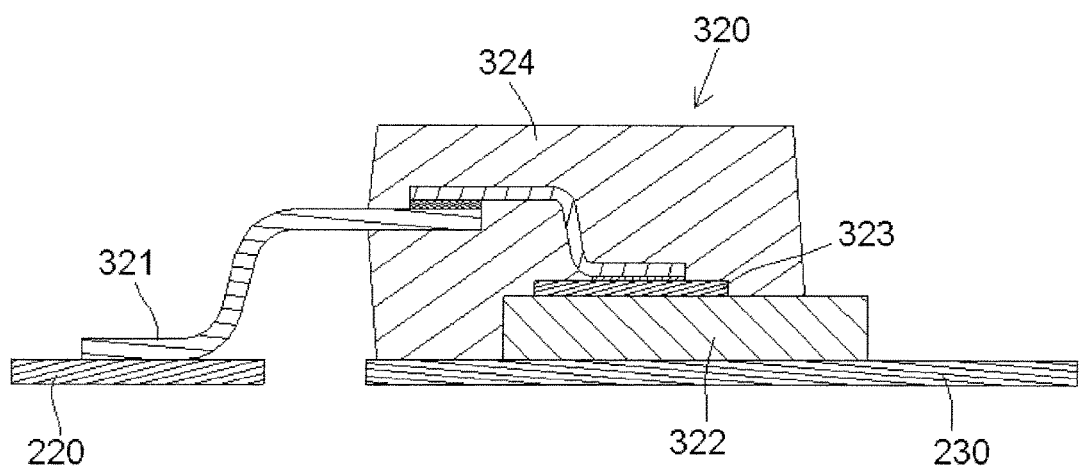
FIG. 6 is a sectional view of a second diode of the diodes of FIG. 4.

As shown in FIG. 6, the second chip 323 of the second diode 320 is directly electrically connected to the negative pin 322 of the second diode 320; the second chip 323 of the second diode 320 may be directly soldered on a top surface of the negative pin 322 of the second diode 320. A positive soldering surface of a bottom of the positive pin 321 of the second diode 320, which is soldered directly onto a surface of the second terminal 220, has a smaller surface area than a negative soldering surface of a bottom of the negative pin 322 of the second diode 320, which is soldered directly onto a surface of the third terminal 230. The negative soldering surface of the negative pin 322 may have between 2 and 1000 times the surface area of the positive soldering surface of the positive pin 321, between 10 and 500 times the surface area of the positive soldering surface of the positive pin 321, or between 20 and 100 times the surface area of the positive soldering surface of the positive pin 321.

The negative pin 322 is disposed on a bottom of a package body 324 of the second diode 320, as shown in FIG. 6, and is electrically connected to a negative surface of the second chip 323. The positive pin 321 is electrically connected to a positive surface of the second chip 323 and extends out from a side of the package body 324. As shown in FIGS. 3 and 4, in an embodiment, the negative pin 322 is a single welding pad and the positive pin 321 has a pair of welding strips spaced apart from each other.

As shown in FIGS. 3 and 4, the plurality of terminals 210, 220, 230, 240 further comprise a fourth terminal 240 adjacent to the third terminal 230. The plurality of diodes 310, 320, 330 further comprise a third diode 330 mounted on the third terminal 230 and the fourth terminal 240. A negative wire 20 extending into the box body 100 is directly electrically connected to the fourth terminal 240. The third diode 330, as shown in FIG. 7, has a third chip 333, a positive pin 331 soldered on the third terminal 230, and a negative pin 332 soldered on the fourth terminal 240.

Figure 7:
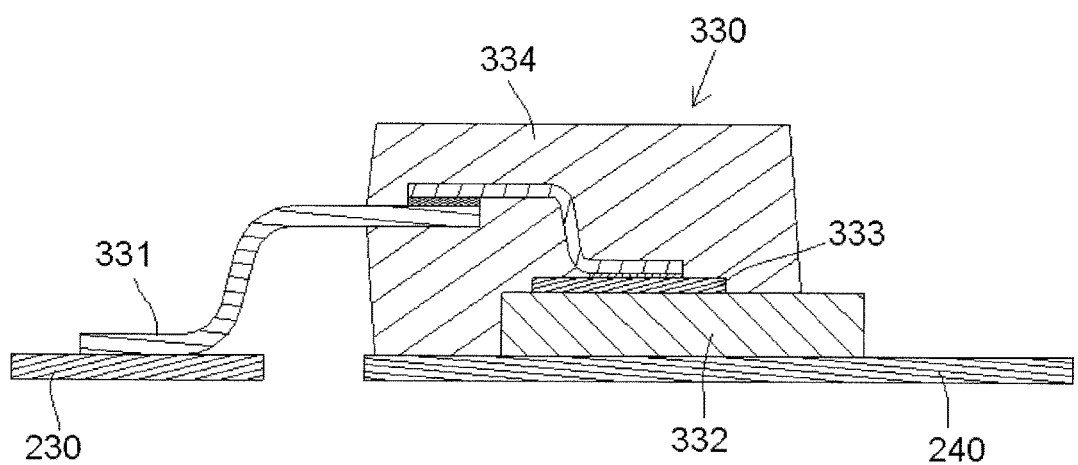
FIG. 7 is a sectional view of a third diode of the diodes of FIG. 4.

As shown in FIG. 7, the third chip 333 of the third diode 330 is directly electrically connected to the negative pin 332 of the third diode 330; the third chip 333 of the third diode 330 may be directly soldered on a top surface of the negative pin 332 of the third diode 330. A positive soldering surface of a bottom of the positive pin 331 of the third diode 330, which is soldered directly onto a surface of the third terminal 230, has a smaller surface area than a negative soldering surface of a bottom of the negative pin 332 of the third diode 330, which is soldered directly onto a surface of the fourth terminal 240. The negative soldering surface of the negative pin 332 may have between 2 and 1000 times the surface area of the positive soldering surface of the positive pin 331, between 10 and 500 times the surface area of the positive soldering surface of the positive pin 331, or between 20 and 100 times the surface area of the positive soldering surface of the positive pin 331.

The negative pin 332 is disposed on a bottom of a package body 334 of the third diode 330, as shown in FIG. 7, and is electrically connected to a negative surface of the third chip 333. The positive pin 331 is electrically connected to a positive surface of the third chip 333 and extends out from a side of the package body 334. As shown in FIGS. 3 and 4, in an embodiment, the negative pin 332 is a single welding pad and the positive pin 331 has a pair of welding strips spaced apart from each other.

As shown in FIGS. 3-5, since the conductor core 11 of the positive wire 10 is directly soldered on the first terminal 210, the heat generated by the first chip 313 of the first diode 310 in use is quickly transferred to the conductor core 11 of the positive wire 10 through the positive pin 311 and the first terminal 210. Thereby, the heat generated by the first chip 313 of the first diode 310 in use is quickly dissipated out of the box body 100 through the conductor core 11 of the positive wire 10, improving the heat dissipation performance, the current carrying capacity, and the reliability of the photovoltaic junction box.

As shown in FIGS. 3, 4, and 7, since the conductor core 21 of the negative wire 20 is directly soldered on the fourth terminal 240, the heat generated by the third chip 333 of the third diode 330 in use is quickly transferred to the conductor core 21 of the negative wire 20 through the negative pin 332 and the fourth terminal 240. Thereby, the heat generated by the third chip 333 of the third diode 330 in use is quickly dissipated out of the box body 100 through the conductor core 21 of the negative wire 20, improving the heat dissipation performance, the current carrying capacity, and the reliability of the photovoltaic junction box.

As shown in FIGS. 3, 4, and 6, the area of the third terminal 230 is larger than that of any one of the first terminal 210, the second terminal 220 and the fourth terminal 240. The heat generated by the second chip 323 of the second diode 320 in use is quickly transferred to the third terminal 230 with the largest area through the negative pin 322. Thereby, the heat generated by the second chip 323 of the second diode 320 in use may be quickly dissipated through the third terminal 230 with the largest area, further improving the heat dissipation performance, the current carrying capacity, and the reliability of the photovoltaic junction box. The area of the first terminal 210, as shown in FIGS. 3 and 4, is substantially equal to that of the fourth terminal 240. In the shown embodiment, since the heat generated by the first chip 313 of the first diode 310 and the heat generated by the third chip 333 of the third diode 330 may be quickly dissipated out of the box body 100 through the conductor 11 of the positive wire 10 and the conductor 21 of the negative wire 20, respectively, the first terminal

210 and the fourth terminal 240 have the smallest areas of the terminals 210, 220, 230, 240 of the photovoltaic junction box.

What is claimed is:

1. A photovoltaic junction box, comprising:
   a box body;
   a plurality of terminals disposed in the box body, a first terminal of the plurality of terminals directly connected to a positive wire extending into the box body and a second terminal of the plurality of terminals disposed adjacent to the first terminal;
   a plurality of diodes disposed in the box body, a first diode of the plurality of diodes having a first positive pin with a first positive soldering surface soldered on the first terminal and a first negative pin with a first negative soldering surface soldered on the second terminal, the first positive soldering surface having a larger surface area than the first negative soldering surface.

2. The photovoltaic junction box of claim 1, wherein each of the plurality of diodes is mounted on adjacent terminals of the plurality of terminals.

3. The photovoltaic junction box of claim 2, wherein each of the plurality of diodes is directly mounted on a surface of adjacent terminals of the plurality of terminals.

4. The photovoltaic junction box of claim 1, wherein the first diode has a first chip directly electrically connected to the first positive pin.

5. The photovoltaic junction box of claim 4, wherein the first chip is directly soldered on a top surface of the first positive pin.

6. The photovoltaic junction box of claim 1, wherein the plurality of terminals further comprise a third terminal disposed adjacent to the second terminal.

7. The photovoltaic junction box of claim 6, wherein the plurality of diodes further comprise a second diode having a second positive pin with a second positive soldering surface soldered on the second terminal and a second negative pin with a second negative soldering surface soldered on the third terminal, the second positive soldering surface having a smaller surface area than the second negative soldering surface.

8. The photovoltaic junction box of claim 7, wherein the second diode has a second chip directly electrically connected to the second negative pin.

9. The photovoltaic junction box of claim 8, wherein an area of the third terminal is larger than an area of the second terminal.

10. The photovoltaic junction box of claim 8, wherein an area of the third terminal is larger than an area of each other terminal of the plurality of terminals.

11. The photovoltaic junction box of claim 9, wherein the plurality of terminals further comprise a fourth terminal disposed adjacent to the third terminal.

12. The photovoltaic junction box of claim 11, wherein a negative wire extending into the box body is directly connected to the fourth terminal.

13. The photovoltaic junction box of claim 12, wherein the plurality of diodes further comprise a third diode having a third positive pin with a third positive soldering surface soldered on the third terminal and a third negative pin with a third negative soldering surface soldered on the fourth terminal, the third positive soldering surface having a smaller surface area than the third negative soldering surface.

14. The photovoltaic junction box of claim 13, wherein the third diode has a third chip directly electrically connected to the third negative pin.

15. The photovoltaic junction box of claim 14, wherein an area of the fourth terminal is substantially equal to an area of the first terminal.

* * * * *